(12) United States Patent
Luo

(10) Patent No.: US 11,944,171 B2
(45) Date of Patent: Apr. 2, 2024

(54) SOLAR-POWERED UMBRELLA

(71) Applicant: Tempo Manufacturing LLC, Nantong (CN)

(72) Inventor: Xiong Luo, Nantong (CN)

(73) Assignee: Tempo Manufacturing LLC, Nantong (CN)

( * ) Notice: Subject to any disclaimer, the term of this patent is extended or adjusted under 35 U.S.C. 154(b) by 190 days.

(21) Appl. No.: 17/754,629

(22) PCT Filed: Nov. 20, 2019

(86) PCT No.: PCT/CN2019/119636
§ 371 (c)(1),
(2) Date: Apr. 7, 2022

(87) PCT Pub. No.: WO2021/068361
PCT Pub. Date: Apr. 15, 2021

(65) Prior Publication Data
US 2022/0386749 A1 Dec. 8, 2022

(30) Foreign Application Priority Data
Oct. 10, 2019 (CN) .......................... 201910957597.1

(51) Int. Cl.
*A45B 25/00* (2006.01)
*H02J 7/35* (2006.01)
*A45B 23/00* (2006.01)

(52) U.S. Cl.
CPC ................ *A45B 25/00* (2013.01); *H02J 7/35* (2013.01); *A45B 2023/0012* (2013.01); *A45B 2200/1018* (2013.01); *A45B 2200/1027* (2013.01)

(58) Field of Classification Search
CPC ................ A45B 2200/1027; A45B 2200/1018
See application file for complete search history.

(56) References Cited

U.S. PATENT DOCUMENTS

| 4,031,381 | A  | * | 6/1977  | Carver ...................... | A45B 3/04 135/910 |
| 6,820,995 | B2 | * | 11/2004 | Lin .......................... | A45B 3/04 362/276 |
| 6,840,657 | B2 | * | 1/2005  | Tung ........................ | A45B 3/04 362/183 |
| 6,991,341 | B1 | * | 1/2006  | Khor ........................ | A45B 3/04 362/205 |

(Continued)

FOREIGN PATENT DOCUMENTS

GB          2533509 A  *  6/2016  ............... A45B 3/04

*Primary Examiner* — Noah Chandler Hawk
(74) *Attorney, Agent, or Firm* — Wang Law Firm, Inc.

(57) ABSTRACT

A solar-powered umbrella has a column, an upper nest having a battery assembly and a plurality of external solar panel modules, and a lower nest having an LED light assembly; solar panels are detachably connected to an input end of the battery assembly through a quick-connect interface; the column has a DC interface, the lower nest has a DC connector; when the umbrella is opened, the lower nest moves upward and the DC connector is inserted into the DC interface, and the power supply system is electrically connected to the LED light assembly to form a lighting circuit. The umbrella is easy to use and is mounted stably and reliably and also provides a wider illumination range.

9 Claims, 11 Drawing Sheets

(56) References Cited

U.S. PATENT DOCUMENTS

| | | | | |
|---|---|---|---|---|
| 7,331,684 B2* | 2/2008 | Tung | ............... | A45B 3/04 |
| | | | | 362/183 |
| 7,571,736 B1* | 8/2009 | Chu | ............... | A45B 3/04 |
| | | | | 135/910 |
| 8,104,491 B2* | 1/2012 | Li | ............... | F24S 25/12 |
| | | | | 135/21 |
| 9,820,540 B2* | 11/2017 | Pan | ............... | A45B 25/143 |
| 2014/0028242 A1* | 1/2014 | Akin | ............... | H01L 31/042 |
| | | | | 320/101 |
| 2016/0198818 A1* | 7/2016 | Akin | ............... | H02J 50/12 |
| | | | | 29/592.1 |

* cited by examiner

SOLAR-POWERED UMBRELLA

TECHNICAL FIELD OF THE INVENTION

The present invention relates to an umbrella, in particular to a solar-powered umbrella.

BACKGROUND OF THE INVENTION

As an outdoor leisure appliance, umbrellas are widely used in squares, beaches, parks, courtyards and other leisure places, providing a comfortable space for people to enjoy the cool. Existing umbrellas generally consist of a piece of fabric, a middle column and a tip. The fabric is disposed between the middle column and the tip, and a frame hinged to the middle column for supporting the fabric is disposed on the middle column. At present, some of the existing umbrellas commercially available only have a single function of keeping out the sun and rain, and some are multi-functional.

Upon inquiry, a Chinese patent CN201720181734.3, titled "Umbrella", disclosed an umbrella comprising a piece of fabric, a middle column and a tip. The fabric is disposed between the middle column and the tip, and a frame hinged to the middle column for supporting the fabric is disposed on the middle column. A flexible thin-film solar panel is disposed on the fabric, a charging unit and a lighting unit are disposed on the middle column, an input end of the charging unit is connected to an output end of the flexible thin-film solar panel while an output end thereof is connected to the lighting unit, and a connecting port for charging electronic devices is further disposed on the charging unit. This umbrella is additionally provided with a lighting function, and its lighting unit is disposed on the middle column, but the umbrella cannot be easily assembled and disassembled due to its complicated connection structure. Moreover, the lighting unit is fixedly located at a too low position below a lower nest, thus resulting in small illumination range and unsatisfactory lighting effect.

Further, a Chinese patent CN2018200049294.0, titled "Novel Solar-Powered Umbrella", disclosed an umbrella comprising a waterproof cover, a flexible solar film, a piece of heatproof fabric, foldable rods, a movable column, a fixed column, a base and a locking knob. The movable column is of a structure raised in the middle and hollow inside, and is in threaded connection with the waterproof cover at its top and formed with a wire hole on its upper side, the foldable rods are sleeved at a position below the wire hole of the movable column, a plurality of slots and a plurality of USB interfaces are disposed on an upper portion of the movable column, and a USB fan and an LED light may be plugged in the slots. A lower portion of the movable column is sleeved inside the fixed column, and an inner side of the heatproof fabric is mounted on the foldable rods while an outer side thereof is connected to buckles on an inner side of the flexible solar film. The solar-powered umbrella has the functions of light and fan, but its structure is complicated, so the movable column needs to be provided additionally. The USB fan and the LED light are plugged in the slots of the movable column, and the LED light needs to be plugged in and out frequently, so that this structure is less convenient to use, and also less ideal in stability and illumination range.

SUMMARY OF THE INVENTION

It is an object of the present invention to provide a solar-powered umbrella which is simple in structure and easy to assemble, disassemble and use.

For achieving the above object, the solar-powered umbrella comprises a column, an upper nest, a lower nest, and a power supply system; wherein, the power supply system comprises a battery assembly and a plurality of external solar panel modules with a plurality of solar panels; the battery assembly and the external solar panel modules are mounted at the top of the upper nest, the solar panels are detachably connected to an input end of the battery assembly through a quick-connect interface; an LED light assembly is mounted on a bottom surface of the lower nest, the column has a DC interface located above the lower nest, which is electrically connected to an output end of the battery assembly; the lower nest has a DC connector for engaging with the DC interface disposed at a top surface of the lower nest, the DC connector is electrically connected to the LED light assembly; when the umbrella is open, the lower nest moves upward and the DC connector is inserted into the DC interface, and the power supply system is electrically connected to the LED light assembly to form a lighting circuit.

Preferably, a fixed base for mounting the battery assembly is disposed at a top of the upper nest and connected to the top of the upper nest through a connector; the battery assembly comprises a battery case, and a plurality of batteries, a plurality of battery elastic pieces and a plurality of Printed Circuit Boards disposed in the battery case; the battery case is a square, rectangular or round case formed by closing an upper cover with a lower cover, the lower cover is fixed on the fixed base by screws, and a battery groove for receiving the batteries recessed at a top of the lower cover, and a slot for receiving the battery elastic pieces is respectively disposed on front and rear sides of the battery groove; the upper cover is covered on the lower cover, a plurality of copper nuts abutted against the battery elastic pieces are disposed on front and rear sides of the upper cover, and a first solar panel is disposed on the top of the upper cover; and the batteries may be in any proper shape, preferably cylindrical, prismatic, button and laminate polymer batteries.

Preferably, two external solar panel modules are respectively disposed on left and right sides of the battery case; each external solar panel module comprises a support and a second solar panel, the width of the support is same as the battery case; a plurality of connecting pieces connected to front and rear sides of the battery case are protruded at front and rear ends of an inner side of the support, and a plurality of connecting holes corresponding to the copper nuts of the upper cover are disposed on each connecting piece; the support is inserted in place on the battery case by the connecting pieces and is fixedly connected to the copper nuts by screwing a plurality of screws into the connecting holes of the connecting piece; and a solar panel cover is disposed on the support, and a second solar panel detachably connecting to the battery assembly through the quick-connect interface is disposed on the solar panel cover.

Preferably, the solar-powered umbrella is a middle-column umbrella, the column is a middle column, the upper nest is fixed at the top of the column, the lower nest is movably disposed on the middle column; a top of each long rod is hinged to the upper nest, a bottom of each short rod is hinged to the lower nest, and a top of each short rod is hinged to the middle of the long rod; a fixed seat is disposed above the lower nest of the column, the fixed seat comprises an upper seat cover and a lower seat cover, the upper seat cover is sleeved on the middle column and fixed by a plurality of rivets, and the DC interface is disposed in a lower opening of the upper seat cover; the lower nest is formed by closing an upper nest cover with a lower nest cover, the lower seat cover is attached to the upper nest cover, and the DC connector is protruded on the lower seat cover corresponding to the DC interface.

Preferably, the LED light assembly comprises a heat sink, an LED light board and a light cover all ring-shaped fitted to and mounted at the bottom of the lower nest sequentially, and are fixed to the lower nest through a plurality of connectors, and a control circuit board for controlling the LED light is disposed in a cavity between the upper nest cover and the lower nest cover.

Preferably, a handle assembly having a handle and a handle cover is disposed at the middle of the middle column; the handle cover has a left cover and a right cover closed with each other and fixed to the middle column, and the handle is mounted between the left cover and the right cover; an LED light controller is mounted on the middle column in the handle cover, and the left cover has a button hole for receiving a button of the LED light controller.

Preferably, the solar-powered umbrella is a side-column umbrella, the column is an extension column, an upper nest is fixed at the top of the column, a lower nest is movably disposed at the bottom of the column, a middle nest is sleeved outside the column; a top of each long rod is hinged to the middle nest, a bottom of each short rod is hinged to the lower nest and a top short rod is hinged to the middle of the long rod; a plurality of second short rods are mounted on the upper nest, a plurality of connecting rods are hinged to the middle of the second short rods, a bottom of each connecting rod is hinged to the long rod, and a connecting sleeve bar sleeved outside the column is disposed at a bottom of the middle nest.

Preferably, a fixed base having an upper base cover and a lower base cover is disposed between a bottom of the connecting sleeve bar and the lower nest; the upper base cover is disposed at the bottom of the connecting sleeve bar and a DC interface is disposed on the upper base cover; and the lower nest is formed by closing an upper nest cover with a lower nest cover, the lower base cover is fixedly disposed on the upper nest cover, and the DC connector is protruded at a position on the lower base cover corresponding to the DC interface.

Preferably, the LED light assembly comprises an upper LED light cover, a lower LED light cover, a heat sink, an LED light board and a light cover, which are all round in shape and fitted to the bottom of the lower nest and are fixed to the lower nest through the connectors; and a control circuit board for controlling the LED light is disposed in a cavity between the upper LED light cover and the lower LED light cover.

Finally, the side-column umbrella further comprises a base and a support bar, the support bar has a handle capable of sliding up and down, a crossbar connected to the middle nest is disposed on the handle; a connecting bar is movably provided on the top of the support bar, one end of the connecting bar is hinged to the middle of the crossbar; an LED light controller is mounted at a middle-lower portion of the support bar and comprises an inner cover, an outer cover, and a control Printed Circuit Board (PCB); and the inner cover is fixed at one side of the support bar, the control PCB is disposed between the inner cover and the outer cover, and a button hole for receiving a button is disposed in the middle of the outer cover.

Compared with the prior art, the present invention has following advantages. The external solar panel modules are disposed to receive more solar energy, and the solar panels of the external solar panel modules are connected to the input end of the battery assembly through the quick-connect interface, so that the solar panels can be easily assembled and disassembled. The LED light is mounted on the lower end face of the lower nest, and the output end of the battery assembly is connected to the lower nest through the DC quick-connect interface, so that the LED light can be turned on or off while the fabric is unfolded or folded, and the umbrella is easy to use and also wide in illumination range. The LED controller is disposed on the middle column to wirelessly control the off, on and dimming of the LED light respectively. According to the present invention, the umbrella is simple, compact and reasonable in structure, the solar panels are easily disassembled and replaced, the battery assembly is connected to and disconnected from the LED light assembly in the process of unfolding and folding the umbrella, so the umbrella is east to use. Furthermore, the LED light is mounted on the lower end face of the lower nest, so it is mounted stably and reliably and also provides a wider illumination range.

DETAILED DESCRIPTION OF THE INVENTION

The present invention will be further described in detail by embodiments with reference to the accompanying drawings.

Figure 1:
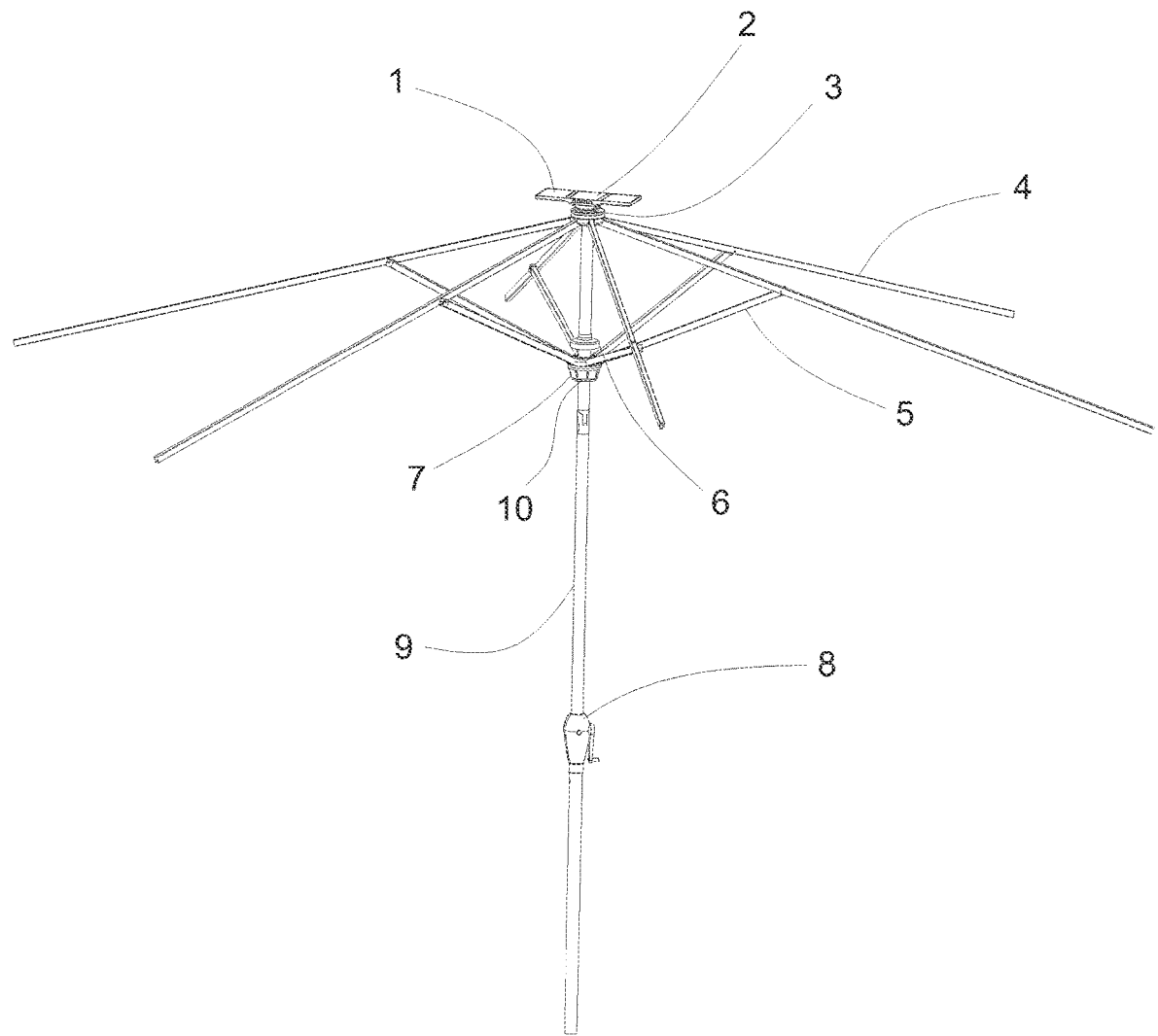
FIG. 1 is a perspective view of a solar-powered umbrella according to Embodiment 1 of the present invention.
Figure 2:
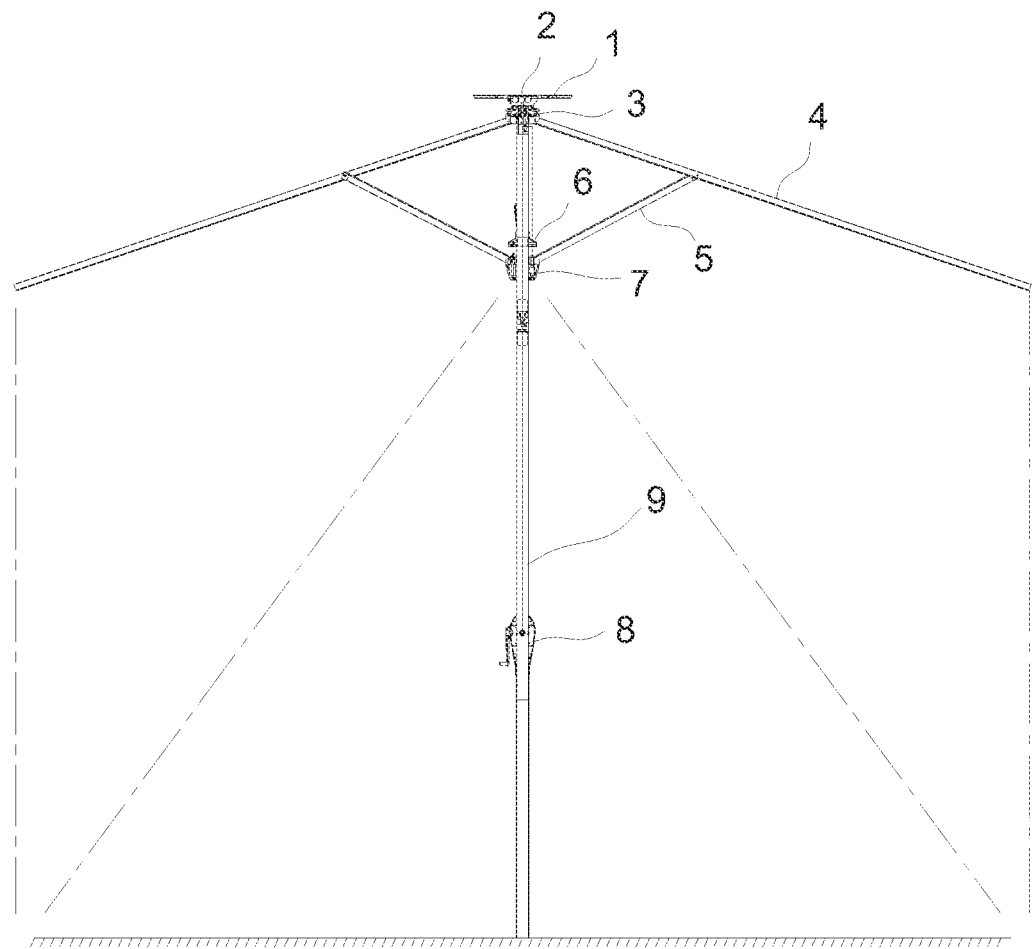
FIG. 2 is a front view of FIG. 1.
Figure 3:
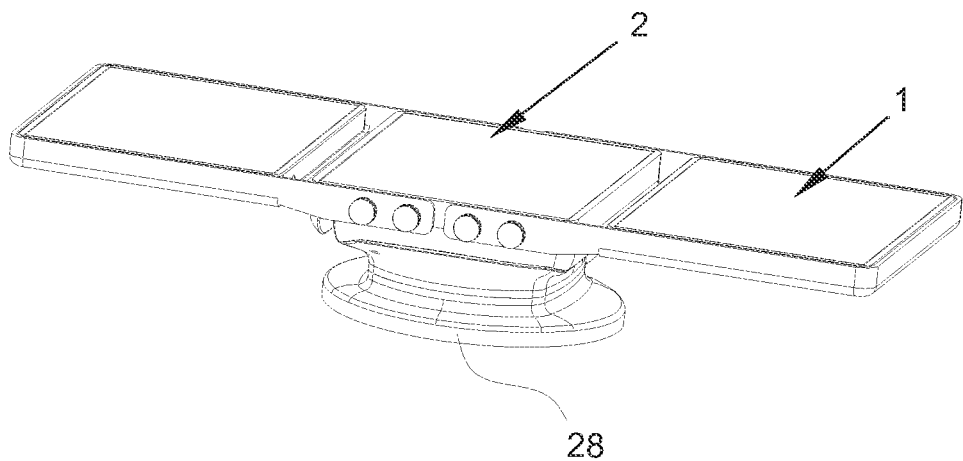
FIG. 3 is a perspective view of a battery assembly and a plurality of external solar panel modules in FIG. 1.
Figure 4:
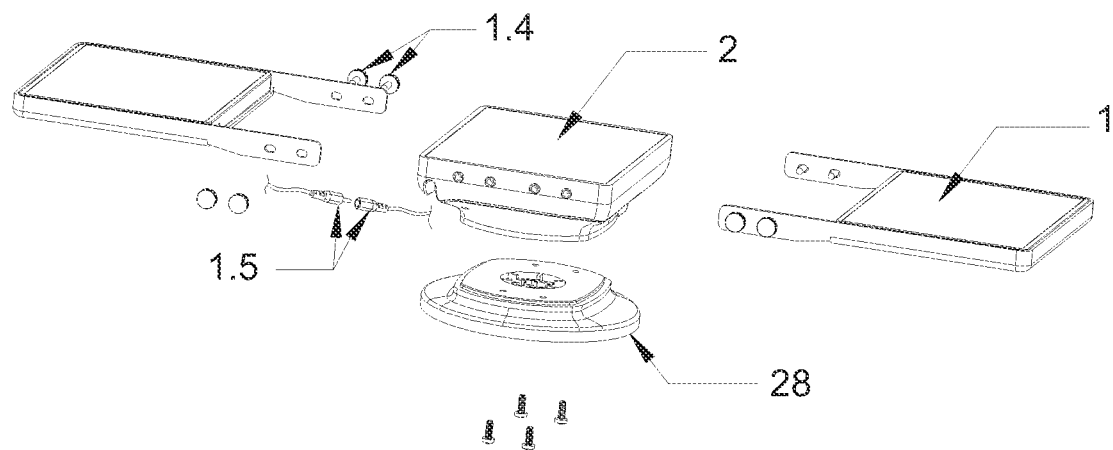
FIG. 4 is an exploded view of FIG. 3.
Figure 5:
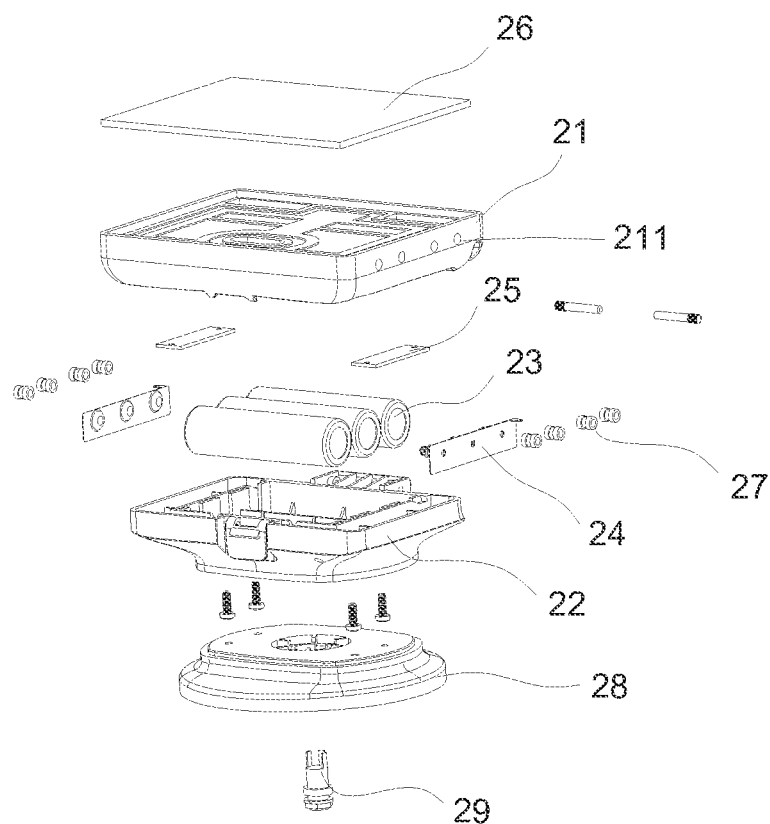
FIG. 5 is an exploded view of the battery assembly in FIG. 4.
Figure 6:
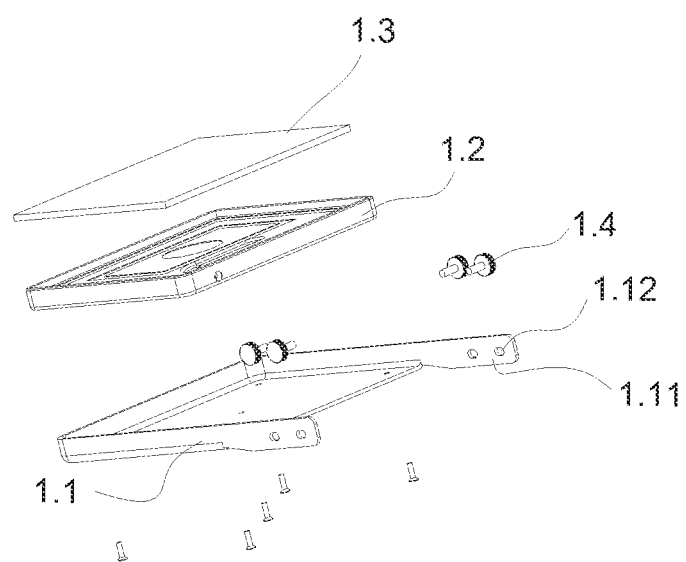
FIG. 6 is an exploded view of the external solar panel module in FIG. 4.
Figure 7:
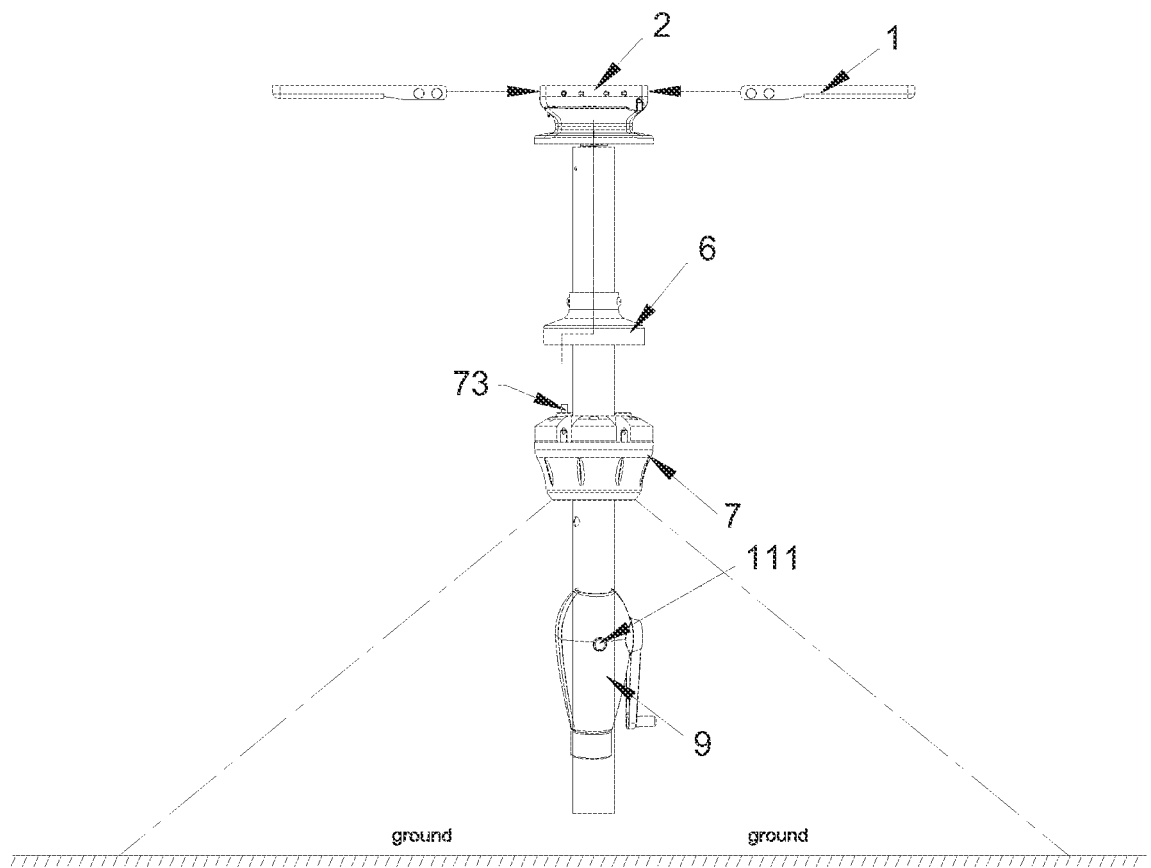
FIG. 7 is a perspective view of the battery assembly fitted to the external solar panel modules, as well as a upper nest and a lower nest and an LED light on a column according to Embodiment 1 of the present invention.
Figure 8:
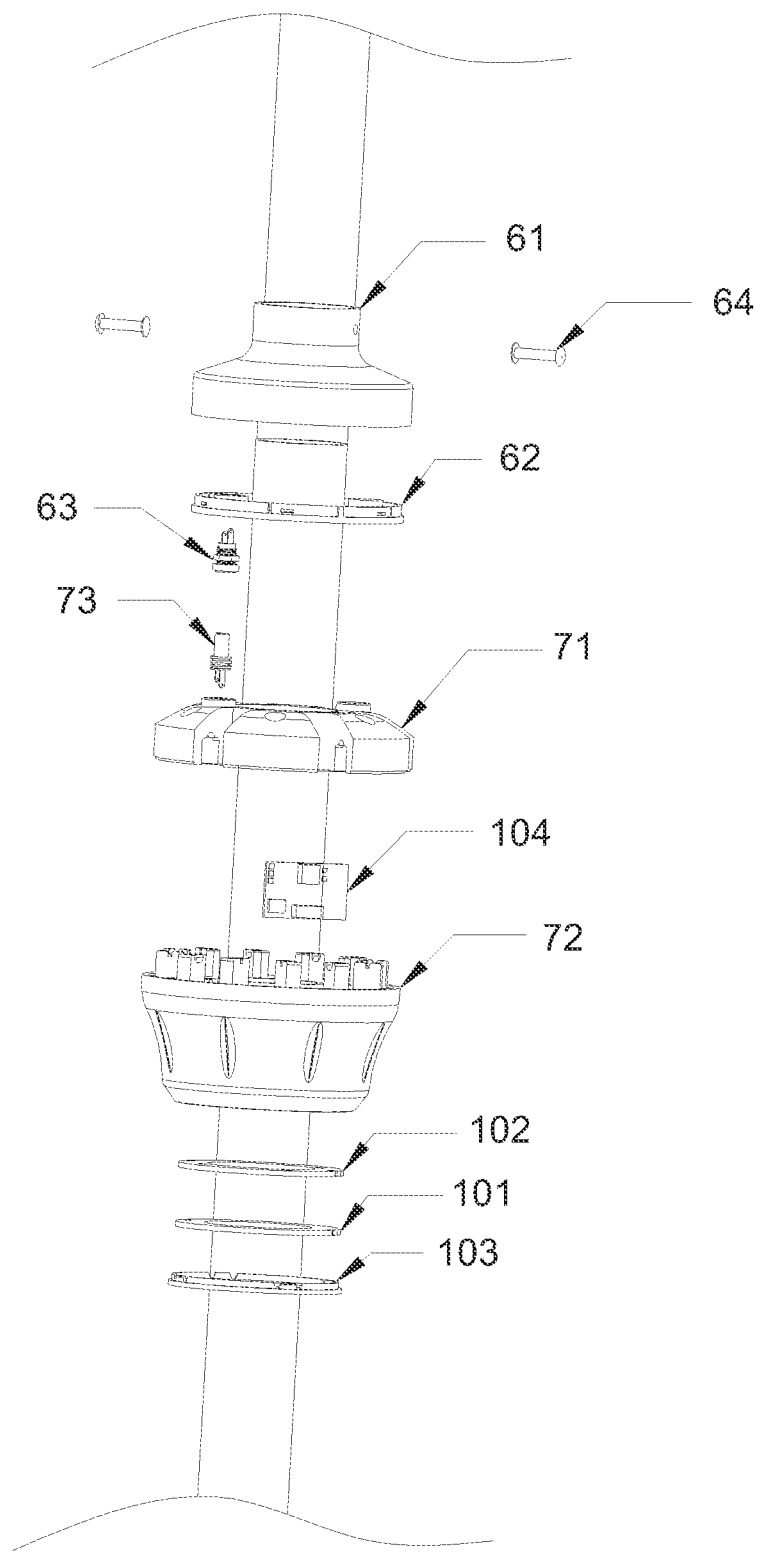
FIG. 8 is an exploded view of the lower nest fitted to a fixed seat in FIG. 7.
Figure 9:
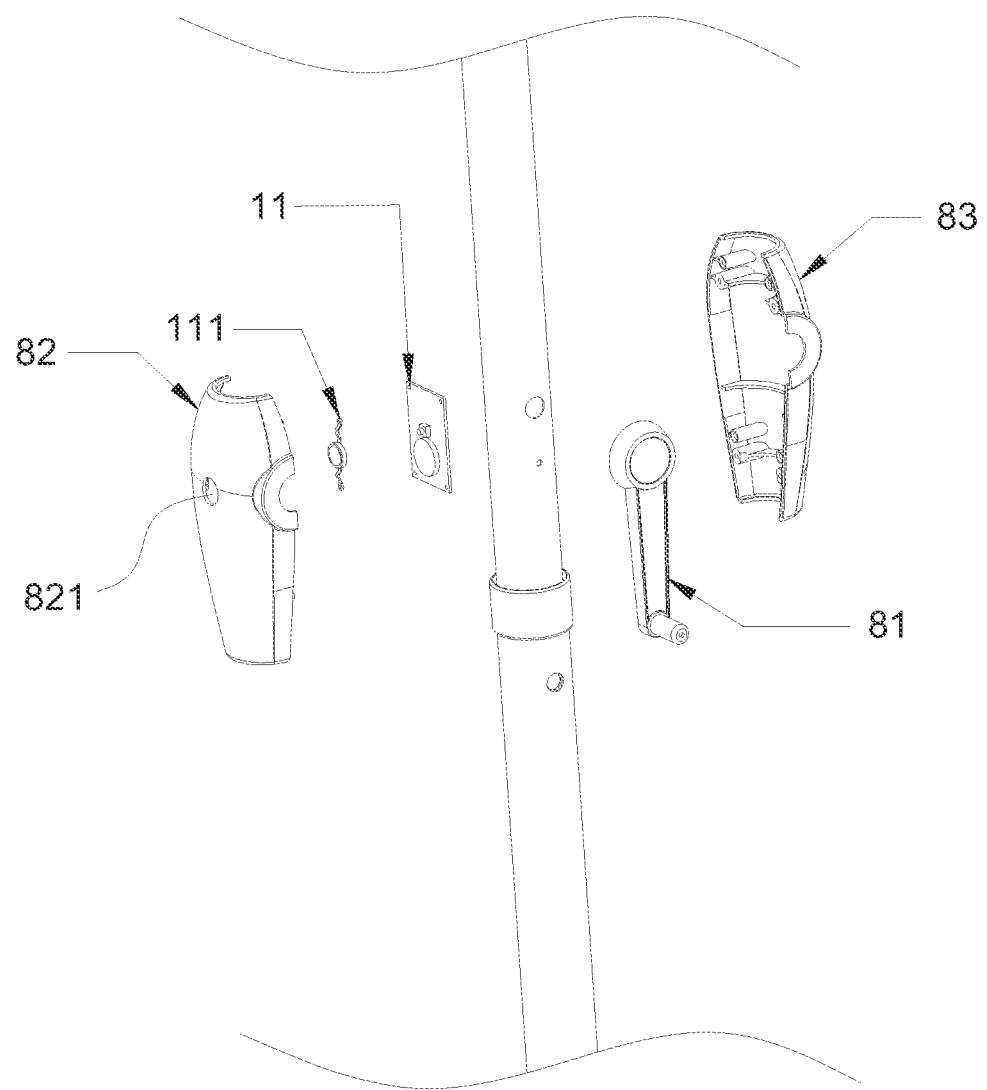
FIG. 9 is an assembly view of a handle, a middle column and an LED light controller.

As shown in FIGS. 1 to 9, a solar-powered umbrella is a middle-column umbrella. The umbrella comprises a middle column 9, an upper nest 3, a lower nest 7, a plurality of long rods 4, a plurality of short rods 5, a handle assembly 8 and a power supply system. The power supply system comprises a battery assembly 2 and a plurality of external solar panel modules 1, the upper nest 3 is fixed at the top of the middle column 9, the lower nest 7 is movably disposed on the middle column 9; a top of each long rod 4 is hinged to the upper nest 3, a bottom of each short rod 5 is hinged to the lower nest 7, and a top of each short rod 5 is hinged to the middle of the long rod 4. The battery assembly 2 and the external solar panel modules 1 are mounted at the top of the upper nest 3, an LED light assembly 10 is mounted on a bottom surface of the lower nest 7, and a plurality of solar panels 1.3 on the external solar panel modules 1 are detachably connected to an input end of the battery assembly 2 through a quick-connect interface, which may be realized by plug-in, snap-in or threaded connection, Specifically, the structure is as follows: a fixed base 28 for mounting the battery assembly 2 is disposed at a top of the upper nest 3 and connected to the top of the upper nest 3 through a connector 29; the battery assembly 2 comprises a battery case, and a plurality of batteries 23, a plurality of battery elastic pieces 24 and a plurality of Printed Circuit Boards 25 disposed in the battery case, where the batteries may be in any proper shape, preferably cylindrical, square, button and laminate polymer batteries, and the battery case is a square, rectangular or round case formed by closing an upper cover 21 with a lower cover 22. The lower cover 22 is fixed on the fixed base 28 by screws, and a battery groove for receiving the batteries 23 recessed at a top of the lower cover 22, there are two battery elastic pieces 24 corresponding to the cathode and anode of the batteries 23, and a slot for receiving the battery elastic pieces 24 is respectively disposed on front and rear sides of the battery groove; the upper cover 21 is covered on the lower cover 22. The upper cover 21 has four connecting holes 211 respectively formed on front and rear sides thereof, a plurality of copper nuts 27 abutted against the battery elastic pieces 24 are disposed in each connecting hole 211, and a first solar panel 26 is disposed on the top of the upper cover 21. Two external solar panel modules 1 are respectively disposed on left and right sides of the battery case; each external solar panel module 1 comprises a support 1.1 and a second solar panel 1.3, the width of the support 1.1 is same as the battery case; a plurality of connecting pieces 1.11 connected to front and rear sides of the battery case are protruded at front and rear ends of an inner side of the support 1.1, and a plurality of connecting holes 1.12 corresponding to the copper nuts 27 of the upper cover 21 are disposed on each connecting piece 1.11; the support 1.1 is inserted in place on the battery case by the connecting pieces 1.11 and is fixedly connected to the copper nuts 27 by screwing a plurality of screws 1.4 into the connecting holes 1.12 of the connecting piece 1.11; and a solar panel cover 1.2 is disposed on the support 1.1, and a second solar panel 1.3 is disposed on the solar panel cover 1.2, and is flush with a first solar panel 26 of the battery assembly 2, and the second solar panel 1.3 is detachably connecting to the battery assembly 2 through the quick-connect interface 1.5.

The middle column 9 has a DC interface 63 located above the lower nest 7, which is electrically connected to an output end of the battery assembly 2; the lower nest 7 has a DC connector 73 for engaging with the DC interface 63 disposed at a top surface of the lower nest 7, the DC connector 73 is electrically connected to the LED light assembly 10; when the umbrella is open, the lower nest 7 moves upward and the DC connector 73 is inserted into the DC interface 63 on the middle column 9, so that the battery assembly 2 is connected to the LED light assembly 10, and the illumination range of the LED light assembly 10 is equal to the coverage of the fabric. Specifically, the structure is as follows: a fixed seat 6 is disposed above the lower nest 7 of the middle column 9, the fixed seat 6 is formed by closing an upper seat cover 61 and a lower seat cover 62, the upper seat cover 61 is sleeved on the middle column 9 and fixed by a plurality of rivets 64, and the DC interface 63 is disposed in a lower opening of the upper seat cover 61; the lower nest 7 is formed by closing an upper nest cover 71 with a lower nest cover 72, and the DC connector 73 is protruded on the upper cover 71 corresponding to the DC interface 63. When the umbrella is open, the lower nest 7 moves upward and the DC connector 73 is inserted into the DC interface 63 so that a lighting system and the power supply system are interconnected. The LED light assembly 10 comprises a heat sink 102, an LED light board 101 and a light cover 103 all ring-shaped fitted to and mounted at the bottom of the lower nest 7 sequentially, and are fixed to the lower nest 7 through a plurality of connectors, and a control circuit board 104 for controlling the LED light is disposed in a cavity between the upper nest cover 71 and the lower nest cover 72. A handle assembly 8 having a handle 81 and a handle cover is disposed at the middle of the middle column 9; the handle cover has a left cover 82 and a right cover 83 closed with each other and fixed to the middle column 9, and the handle 81 is mounted between the left cover 82 and the right cover 83. The handle 81 is of a structure the same as that in the prior art, so there is no more description on the specific structure principle. An LED light controller 11 is mounted on the middle column 9 in the handle cover, and the left cover 82 has a button hole 821 for receiving a button 111 of the LED light controller 11, and the button 111 is a three-mode button to control the off, on and dimming of the LED light respectively.

When in use of the umbrella, the handle 81 is wound to make the lower nest 7 move up to open the fabric. When the fabric is opened in place, the lower seat cover 62 above the lower nest 7 is docked with the upper cover 71 of the lower nest, and the DC connector 73 is correspondingly inserted into the DC interface 63 before power on. In this case, the off, on and dimming of the LED light may be controlled by operating the button 111 of the LED light controller 11. After the fabric is opened, the illumination range from an emission angle of the LED light to the ground is equal to the coverage of the fabric. In the process of folding the umbrella, the handle 81 is reversely wound to make the lower nest 7 move down, the DC connector 73 is disconnected from the DC interface 63, the lighting system is turned off, and the fabric 100 is folded at the same time.

Embodiment 2

Figure 10:
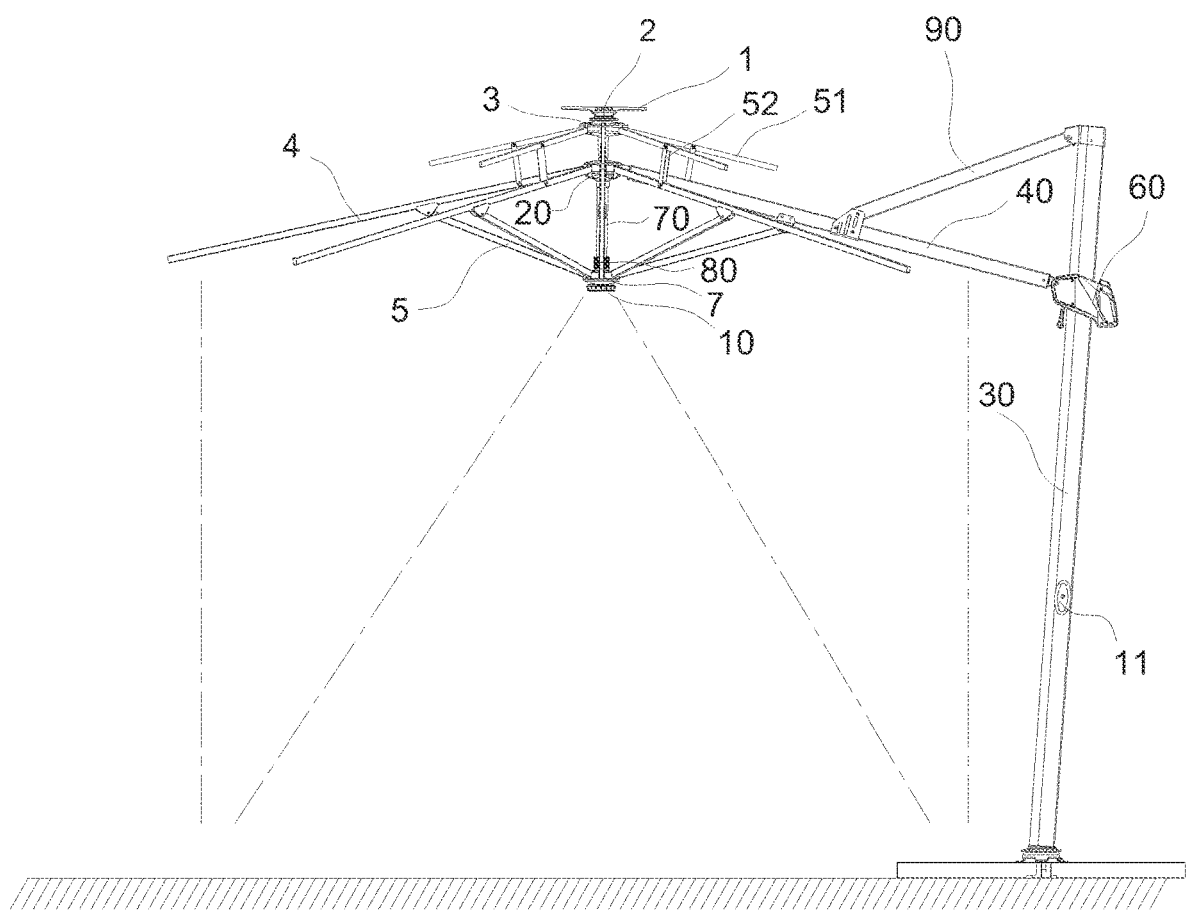
FIG. 10 is a perspective view of the solar-powered umbrella according to Embodiment 2 of the present invention.
Figure 11:
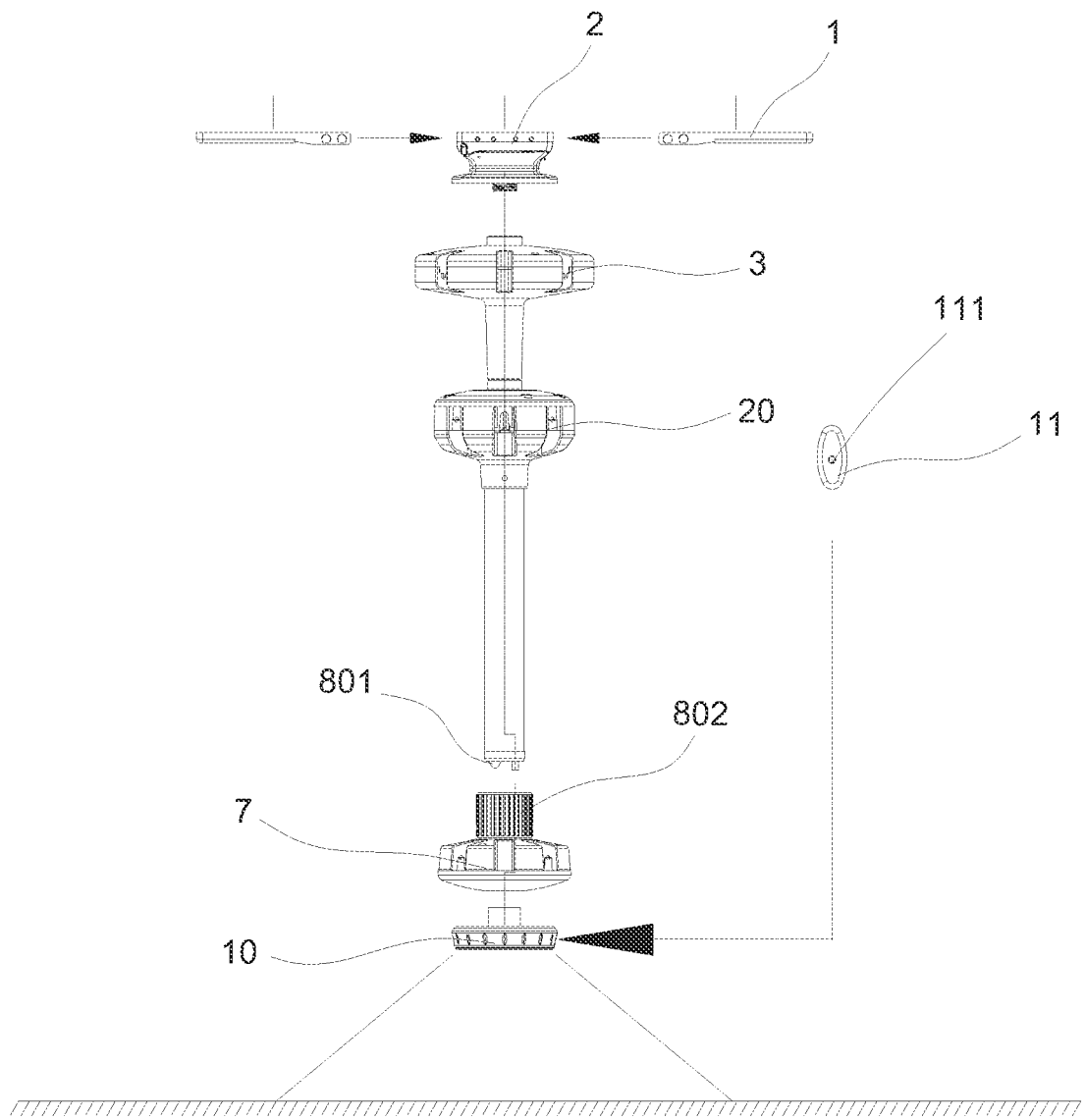
FIG. 11 is a perspective view of the battery assembly fitted to the external solar panel modules, as well as the upper and lower nests and the LED light on the column in Embodiment 2.
Figure 12:
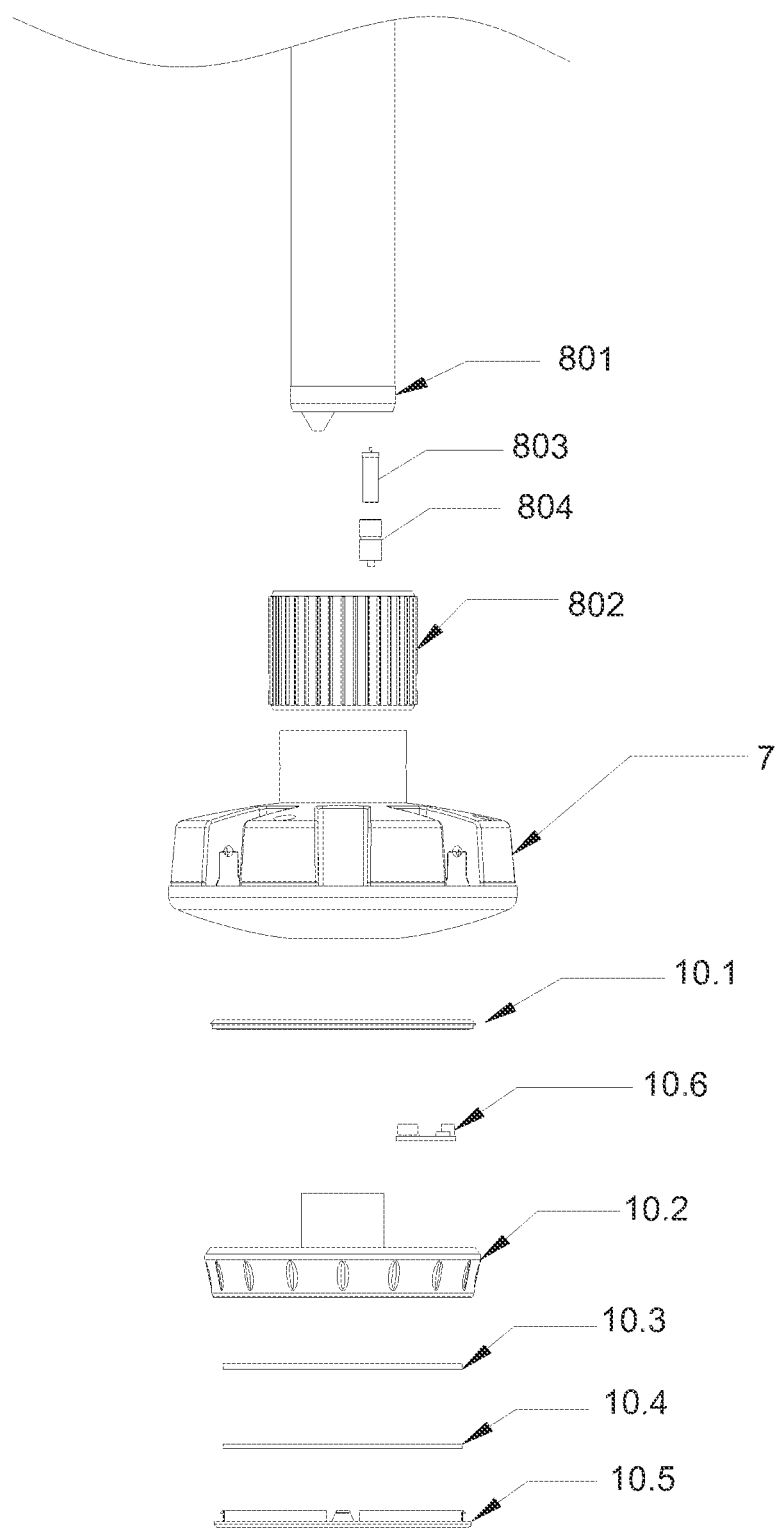
FIG. 12 is an exploded view of a power connector, the lower nest and the LED light in FIG. 11.
Figure 13:
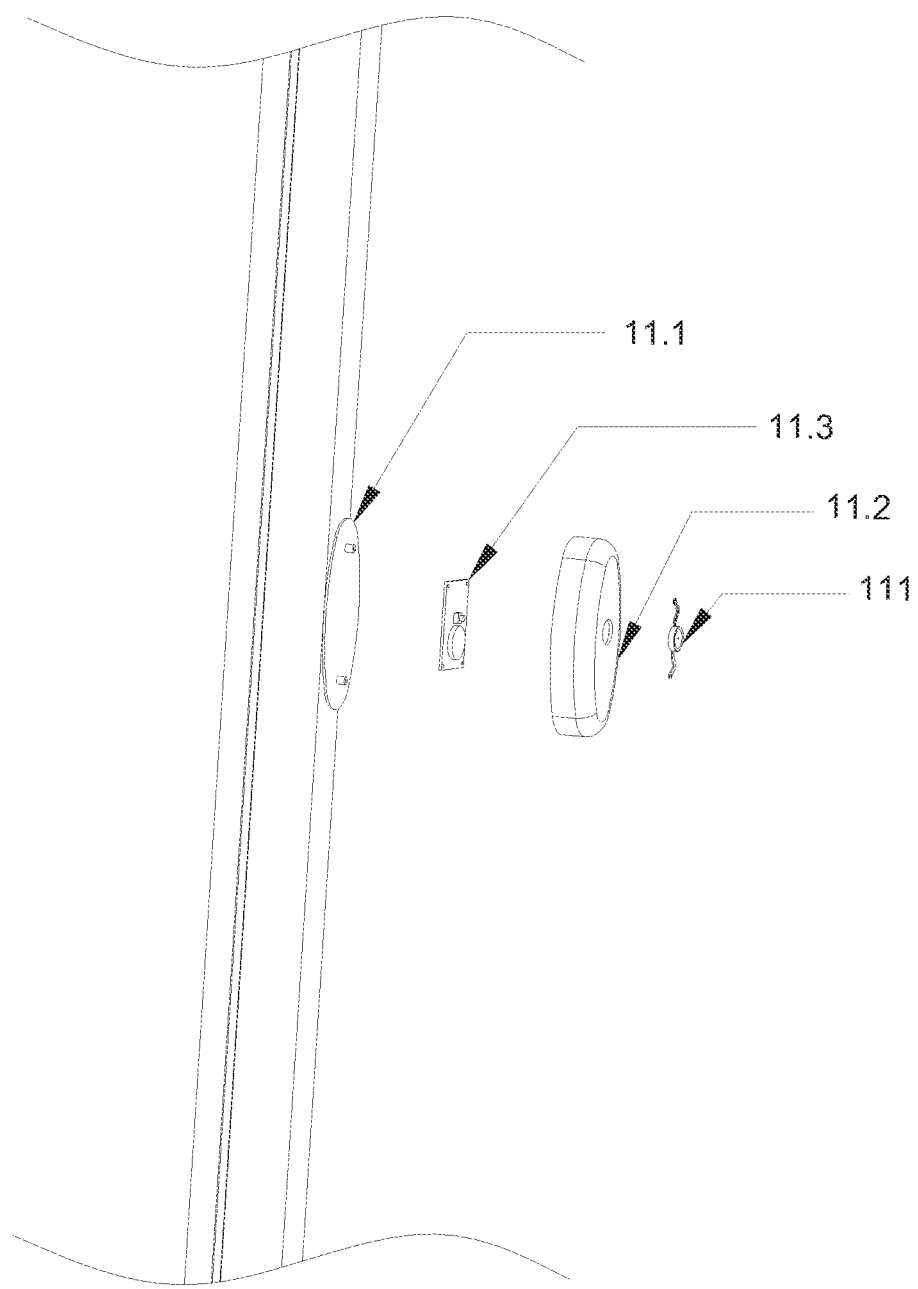
FIG. 13 is an assembly view of the LED light controller in FIG. 10.

FIGS. 10-13 show a solar-powered umbrella according to Embodiment 2. The difference of Embodiment 2 from Embodiment 1 is that, the solar-powered umbrella in this embodiment is a side-column umbrella with an extension column, the umbrella comprises a base, a support bar 11, an upper nest 3, a lower nest 7, a middle nest 20, a plurality of long rods 4, a plurality of short rods 5, a plurality of second short rods 51, a handle 60, a crossbar 40, a connecting bar 90, a battery assembly 2, and a plurality of external solar panel modules 1.

An upper nest 3 is fixed at the top of the column, a lower nest 7 is movably disposed at the bottom of the column, a middle nest 20 is sleeved outside the column; a top of each long rod 4 is hinged to the middle nest 20, a bottom of each short rod 5 is hinged to the lower nest 7 and a top short rod 5 is hinged to the middle of the long rod 4; a plurality of second short rods 51 are mounted on the upper nest 3, a plurality of connecting rods 52 are hinged to the middle of the second short rods 51, a bottom of each connecting rod 52 is hinged to the long rod 4, and a connecting sleeve bar 70 sleeved outside the column is disposed at a bottom of the middle nest 20, and the battery assembly 2 and the external solar panel modules 1 are mounted at the top of the upper nest 3, with the same structure and assembly method as those in Embodiment 1. A fixed base 80 having an upper base cover 801 and a lower base cover 802 is disposed between a bottom of the connecting sleeve bar 70 and the lower nest 7; the upper base cover 801 is disposed at the bottom of the connecting sleeve bar 70 and a DC interface 803 is disposed on the upper base cover 801. The lower base cover 802 is fixedly disposed on the upper nest cover 71, and the DC connector 804 is protruded at a position on the lower base cover 802 correspondingly inserted into the DC interface 803. The LED light assembly 10 comprises an upper LED light cover 10.1, a lower LED light cover 10.2, a heat sink 10.3, an LED light board 10.4 and a light cover 10.5, which are all round in shape and fitted to the bottom of the lower nest 7 and are fixed to the lower nest 7 through the connectors; and a control circuit board 10.6 for controlling the LED light is disposed in a cavity between the upper LED light cover 10.1 and the lower LED light cover 10.2. The handle 60 may be mounted on and slide along an upper portion of the support bar 30, one end of the crossbar 40 is hinged to the handle 60 while the other end is connected to the middle nest 20. A connecting bar 90 is movably provided on the top of the support bar 30, one end of the connecting bar 90 is hinged to the middle of the crossbar 40. The handle 60 is of a structure the same as that in the prior art, so there is no more description on the specific structure principle. In this way, the fabric can be opened and folded by sliding the handle 60 up and down. An LED light controller 11 is mounted at a middle-lower portion of the support bar 30 and comprises an inner cover 11.1, an outer cover 11.2, and a control PCB 11.3; and the inner cover 11.1 is fixed at one side of the support bar 30, the control PCB 11.3 is disposed between the inner cover 11.1 and the outer cover 11.2, and a button hole 821 for receiving a button 111 is disposed in the middle of the outer cover 11.2, and the button 111 is a three-mode button to control the off, on and dimming of the LED light respectively.

When in use of the umbrella, the handle 60 is pushed to move up to make the middle nest 20 move down to unfold the fabric. When the fabric is opened in place, the lower base cover 802 above the lower nest 7 is docked with the upper base cover 801, and the DC connector 804 is correspondingly inserted into the DC interface 803 before power on. In this case, the off, on and dimming of the LED light may be controlled by operating the button 111 of the LED light controller 11. After the fabric is opened, the illumination range from an emission angle of the LED light to the ground is equal to the coverage of the fabric. In the process of folding the umbrella, the handle 60 is pulled to move down, the DC connector 804 is disconnected from the DC interface 803, the lighting system is turned off, and the fabric 100 is folded at the same time.

The protection scope of the present invention is not limited to each embodiments described in this description. Any changes and replacements made on the basis of the scope of the present invention patent and of the description shall be included in the scope of the present invention patent.

The invention claimed is:

1. A solar-powered umbrella, comprising a column, an upper nest, a lower nest, a plurality of long rods, a plurality of short rods, and a power supply system;

wherein,
the power supply system comprises a battery assembly and a plurality of external solar panel modules with a plurality of solar panels;

the battery assembly comprises a battery case, and a plurality of batteries, a plurality of battery elastic pieces and a plurality of Printed Circuit Boards disposed in the battery case;

a fixed base for mounting the battery assembly is disposed at a top of the upper nest and connected to the top of the upper nest through a connector;

the battery assembly and the external solar panel modules are mounted at the top of the upper nest, the solar panels are detachably connected to an input end of the battery assembly through a quick-connect interface;

the battery case is a square, rectangular or round case formed by closing an upper cover with a lower cover, the lower cover is fixed on the fixed base by screws, and a battery groove for receiving the batteries is recessed at a top of the lower cover, and a slot for receiving the battery elastic pieces is respectively disposed on front and rear sides of the battery groove;

the upper cover is covered on the lower cover, a plurality of copper nuts abutted against the battery elastic pieces is disposed on front and rear sides of the upper cover, and a first solar panel is disposed on the top of the upper cover, an LED light assembly is mounted on a bottom surface of the lower nest, the column has a DC interface located above the lower nest, which is electrically connected to an output end of the battery assembly;

the lower nest has a DC connector for engaging with the DC interface, the DC connector is electrically connected to the LED light assembly;

when the umbrella is open, the lower nest moves upward and the DC connector is inserted into the DC interface, and the power supply system is electrically connected to the LED light assembly to form a lighting circuit.

2. The umbrella of claim 1, wherein two external solar panel modules are respectively disposed on left and right sides of the battery case;

each external solar panel module comprises a support and a second solar panel, the width of the support is same as the battery case;

a plurality of connecting pieces connected to front and rear sides of the battery case are protruded at front and rear ends of an inner side of the support, and a plurality of connecting holes corresponding to the copper nuts of the upper cover are disposed on each connecting piece;

the support is inserted in place on the battery case by the connecting pieces and is fixedly connected to the copper nuts by screwing a plurality of screws into the connecting holes of the connecting piece; and a solar panel cover is disposed on the support, and a second solar panel detachably connecting to the battery assembly through the quick-connect interface is disposed on the solar panel cover.

3. The umbrella of claim 1, wherein the solar-powered umbrella is a middle-column umbrella, the column is a middle column, the upper nest is fixed at the top of the column, the lower nest is movably disposed on the middle column;

a top of each long rod is hinged to the upper nest, a bottom of each short rod is hinged to the lower nest, and a top of each short rod is hinged to a middle of each long rod;

a fixed seat is disposed above the lower nest of the column, the fixed seat comprises an upper seat cover and a lower seat cover, the upper seat cover is sleeved on the middle column and fixed by a plurality of rivets, and the DC interface is disposed in a lower opening of the upper seat cover;

the lower nest is formed by closing an upper nest cover with a lower nest cover, the lower seat cover can dock with the upper nest cover, and the DC connector protrudes on the upper nest cover corresponding to the DC interface.

4. The umbrella of claim 3, wherein the LED light assembly comprises a heat sink, an LED light board and a light cover all ring-shaped fitted to and mounted at the bottom of the lower nest sequentially, and are fixed to the lower nest through a plurality of connectors, and a control circuit board for controlling the LED light is disposed in a cavity between the upper nest cover and the lower nest cover.

5. The umbrella of claim 4, wherein a handle assembly having a handle and a handle cover is disposed at the middle of the middle column;

the handle cover has a left cover and a right cover closed with each other and fixed to the middle column, and the handle is mounted between the left cover and the right cover;

an LED light controller is mounted on the middle column in the handle cover, and the left cover has a button hole for receiving a button of the LED light controller.

6. The umbrella of claim 1, wherein the solar-powered umbrella is a side-column umbrella, the column is an extension column, an upper nest is fixed at the top of the column, a lower nest is movably disposed at the bottom of the column, a middle nest is sleeved outside the column;

a top of each long rod is hinged to the middle nest, a bottom of each short rod is hinged to the lower nest and a top of each short rod is hinged to a middle of each long rod;

a plurality of second short rods is mounted on the upper nest, each of a plurality of connecting rods hinge to a middle of each second short rod, a bottom of each connecting rod is hinged to each long rod, and a connecting sleeve bar sleeved outside the column is disposed at a bottom of the middle nest.

7. The umbrella of claim 6, wherein a fixed base having an upper base cover and a lower base cover is disposed between a bottom of the connecting sleeve bar and the lower nest;

the upper base cover is disposed at the bottom of the connecting sleeve bar and the DC interface is disposed on the upper base cover; and the lower nest is formed by closing an upper nest cover with a lower nest cover, the lower base cover is fixedly disposed on the upper nest cover, and the DC connector is protruded at a position on the lower base cover corresponding to the DC interface.

8. The umbrella of claim 7, wherein the LED light assembly comprises an upper LED light cover, a lower LED light cover, a heat sink, an LED light board and a light cover, which are all round in shape and fitted to the bottom of the lower nest and are fixed to the lower nest through the connectors; and a control circuit board for controlling the LED light is disposed in a cavity between the upper LED light cover and the lower LED light cover.

9. The umbrella of claim 8, wherein the side-column umbrella further comprises a base and a support bar, the support bar has a handle capable of sliding up and down, a crossbar connected to the middle nest is disposed on the handle;

a connecting bar is movably provided on the top of the support bar, one end of the connecting bar is hinged to the middle of the crossbar;

an LED light controller is mounted at a middle-lower portion of the support bar and comprises an inner cover, an outer cover, and a control Printed Circuit Board (PCB); and the inner cover is fixed at one side of the support bar, the control PCB is disposed between the inner cover and the outer cover, and a button hole for receiving a button is disposed in the middle of the outer cover.

* * * * *